US011742233B2

(12) United States Patent
Broekaart et al.

(10) Patent No.: US 11,742,233 B2
(45) Date of Patent: Aug. 29, 2023

(54) METHOD OF MECHANICAL SEPARATION FOR A DOUBLE LAYER TRANSFER

(71) Applicant: Soitec, Bernin (FR)

(72) Inventors: Marcel Broekaart, Theys (FR); Ionut Radu, Crolles (FR); Didier Landru, Le Champ-près-Froges (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/135,340

(22) Filed: Dec. 28, 2020

(65) Prior Publication Data

US 2021/0118717 A1   Apr. 22, 2021

Related U.S. Application Data

(63) Continuation of application No. 15/170,532, filed on Jun. 1, 2016, now Pat. No. 10,910,250.

(30) Foreign Application Priority Data

Jun. 5, 2015   (DE) .......................... 102015210384.6

(51) Int. Cl.
*H01L 21/683*   (2006.01)
*H01L 21/48*   (2006.01)
*H01L 21/762*   (2006.01)

(52) U.S. Cl.
CPC ...... *H01L 21/6835* (2013.01); *H01L 21/4803* (2013.01); *H01L 21/76251* (2013.01);
(Continued)

(58) Field of Classification Search
CPC ............. H01L 21/6835; H01L 21/4803; H01L 21/76251; H01L 21/7806; H01L 21/01123;
(Continued)

(56) References Cited

U.S. PATENT DOCUMENTS 6,391,743 B1 * 5/2002 Iwane ............... H01L 21/67092
438/455
6,562,648 B1   5/2003 Wong et al.
(Continued)

FOREIGN PATENT DOCUMENTS

CN        1607638 A     4/2005
CN     101512721 A     8/2009
(Continued)

OTHER PUBLICATIONS

Australian Examination Report for Australian Application No. 2016203094 dated Mar. 3, 2017, 5 pages.
(Continued)

*Primary Examiner* — Kyoung Lee
*Assistant Examiner* — Christina A Sylvia
(74) *Attorney, Agent, or Firm* — TraskBritt

(57) ABSTRACT

The present disclosure relates to a method for mechanically separating layers, in particular in a double layer transfer process. The present disclosure relates more in particular to a method for mechanically separating layers, comprising the steps of providing a semiconductor compound comprising a layer of a handle substrate and an active layer with a front main side and a back main side opposite the front main side, wherein the layer of the handle substrate is attached to the front main side of the active layer, then providing a layer of a carrier substrate onto the back main side of the active layer, and then initiating mechanical separation of the layer of the handle substrate, wherein the layer of the handle substrate and the layer of the carrier substrate are provided with a substantially symmetrical mechanical structure.

12 Claims, 4 Drawing Sheets

(52) U.S. Cl.
CPC .................. *H01L 2221/6835* (2013.01); *H01L 2221/68368* (2013.01); *H01L 2221/68381* (2013.01)

(58) Field of Classification Search
CPC ......... H01L 21/02123; H01L 21/02595; H01L 21/67092; H01L 2221/6835; H01L 2221/68368; H01L 2221/68381; H01L 24/27; H01L 24/28; B32B 43/006
See application file for complete search history.

(56) References Cited

U.S. PATENT DOCUMENTS

| | | | |
|---|---|---|---|
| 8,476,148 B2 | 7/2013 | Kerdiles et al. | |
| 10,164,144 B2 | 12/2018 | Henley et al. | |
| 2004/0002197 A1 | 1/2004 | Fathimulla et al. | |
| 2005/0082526 A1 | 4/2005 | Bedell et al. | |
| 2007/0281439 A1 | 12/2007 | Bedell et al. | |
| 2008/0016066 A1 | 1/2008 | Kuznetsov et al. | |
| 2008/0102601 A1* | 5/2008 | Bourdelle | H01L 21/02667 257/E21.133 |
| 2010/0190416 A1 | 7/2010 | Schwarzenbach et al. | |
| 2011/0097874 A1 | 4/2011 | Broekaart et al. | |
| 2013/0228920 A1* | 9/2013 | Chiou | H01L 23/49811 257/737 |
| 2013/0295696 A1 | 11/2013 | Kerdiles et al. | |
| 2014/0106649 A1* | 4/2014 | Kim | H01L 21/6835 451/54 |
| 2014/0130969 A1* | 5/2014 | McCutcheon | B32B 7/06 156/247 |
| 2014/0187020 A1 | 7/2014 | Libbert et al. | |
| 2014/0295642 A1* | 10/2014 | Fournel | H01L 31/1892 257/629 |
| 2014/0352440 A1* | 12/2014 | Fennell | G01N 29/22 29/25.35 |
| 2014/0353853 A1 | 12/2014 | Rossini et al. | |
| 2015/0221544 A1* | 8/2015 | Landru | H01L 21/76251 438/458 |

FOREIGN PATENT DOCUMENTS

| | | |
|---|---|---|
| CN | 101791780 A | 8/2010 |
| CN | 103875062 A | 6/2014 |
| EP | 2246882 B1 | 11/2010 |
| FR | 2997553 A1 | 5/2014 |
| FR | 2997554 A1 | 5/2014 |
| JP | 2010-263187 A | 11/2010 |
| JP | 2011-173374 A | 9/2011 |
| JP | 2014-534621 A | 12/2014 |
| JP | 2015-092632 A | 5/2015 |
| KR | 10-2005-0084568 A | 8/2005 |
| KR | 10-2009-0099019 A | 9/2009 |
| KR | 10-2010-0095021 A | 8/2010 |
| KR | 10-2011-0062365 A | 6/2011 |
| WO | 2015/145238 A1 | 10/2015 |

OTHER PUBLICATIONS

Australian Examination Report No. 2 for Australian Application No. 2016203094 dated Nov. 21, 2017, 3 pages.
Bartek et al., "Characterization of High-Resistivity Polycrystalline Silicon Substrates for Wafer-Level Packaging and Integration of RF Passives," Delft University of Technology, Lab. of High-Frequency Technology and Components, 2004.
Belgian Search Report for Belgian Application No. 201605406 dated Jan. 24, 2017, 12 pages.
Chinese Office Action for Chinese Application No. P2016-094007 dated Apr. 4, 2017, 3 pages.
Chinese Search Report for Chinese Application No. 201610391128. 4, dated Aug. 27, 2018, 2 pages.
French Search Report and Opinion for French Application No. 1653990 dated Aug. 20, 2019, 6 pages.
German Search Report for German Aplication No. 102015210384.6 dated Feb. 2, 2016, 9 pages.
Israeli Notification of Deficiencies in Patent Application No. 245492 dated Nov. 24, 2019, 4 pages.
Japanese Notification of Reasons for Refusal for Japanese Application No. 2016-094007, dated Mar. 28, 2017, 3 pages.
Japanese Second Notification of Reasons for Refusal for Japanese Application No. 2016-094007, dated Jan. 9, 2018, 2 pages.
Korean Notice of Preliminary Rejection for Korean Application No. 10-2016-0064274, dated Jul. 19, 2017, 4 pages.
M. Bartek; A. Polyakov; S.M. Sinaga; P.M. Mendes; J.H. Correi, "Characterization of high-resistivity polycrystalline siliconsubstrates for wafer-level packaging and integration of RF passives", Advanced Semiconductor Devices and Microsystems2004. ASDAM 2004. The Fifth International Conference on, pp. 227-230, 2004.
Taiwan Office Action for Taiwanese application No. 105114202 dated Jan. 6, 2020.

* cited by examiner

METHOD OF MECHANICAL SEPARATION FOR A DOUBLE LAYER TRANSFER

CROSS-REFERENCE TO RELATED APPLICATIONS

This application is a continuation of U.S. patent application Ser. No. 15/170,532, filed Jun. 1, 2016, now U.S. Pat. No. 10,910,250, issued Feb. 2, 2021, which, pursuant to 35 U.S.C. § 119(a), claims the benefit of the filing date of German Patent Application Serial No. 102015210384.6, filed Jun. 5, 2015, for "Method of Mechanical Separation for a Double Layer Transfer," the disclosure of each of which are incorporated herein in its entirety by this reference.

TECHNICAL FIELD

The present disclosure relates to a method for mechanically separating layers, in particular in a double layer transfer process.

BACKGROUND

Layer transfer of electronic devices using wafer bonding is commonly used in several semiconductor applications. Double (or dual) layer transfer (DLT) of an active layer device is particularly important when upgrading semiconductor devices, for instance when replacing an initial carrier substrate carrying an active layer with a new carrier substrate of a different material providing a better performance of the active layer device.

FIG. 1 schematically illustrates an example of a known DLT process for replacing the initial carrier substrate of an active layer device 100 with a new carrier substrate. In this known process, the active layer device 100 comprises an initial Si or glass carrier substrate 101 carrying an active device layer 102 with a buried oxide layer (BOX) 103 in between.

According to the known process and as further illustrated in FIG. 1, a temporary Si handle substrate 104 is then attached to the active layer 102 on the side of the active layer device 100 opposite the initial Si carrier substrate 101, thereby forming an intermediate compound 105.

As further illustrated, the initial Si carrier substrate 101 is then detached from the intermediate compound 105, typically by mechanical separation using a blade or an edge inserted at the interface between the initial Si carrier substrate 101 and the BOX layer 103 or, alternatively, by grinding and/or etching, thereby forming a subsequent intermediate compound 106. At this stage, in case of a mechanical separation, the initial carrier substrate 101 risks being damaged and even broken due to the stress created thereon by the blade or the edge. In the case of grinding and/or etching, there are risks of particle insertions. Thus, at this stage, there are risks that the initial carrier substrate 101 cannot be recycled. Such risks may be acceptable depending on whether it is desired to reuse the initial carrier substrate 101 or not for other processes.

FIG. 1 then illustrates that a final high resistivity (HR) carrier substrate 107 is subsequently attached, for instance by direct bonding or by any suitable layer transfer technology, to the active device layer 102 at the BOX layer 103, instead of the detached initial Si carrier substrate 101, thereby forming a subsequent intermediate compound 108. Depending on the applications, it is known to use homogeneous (e.g., RF substrates) or composite (e.g., multi-layer) substrates for the final HR carrier substrate 107. Furthermore, it is known that the attachment step may require additional complex steps of surface preparation.

The temporary Si handle substrate 104 used during the DLT process is then detached by mechanical separation. A blade or an edge is introduced at the interface between the active layer 102 and the temporary Si handle substrate 104 to initiate the mechanical separation along the interface in view of obtaining the desired final active layer device 110.

However, at this stage, the mechanical force needed to remove the temporary Si handle substrate 104 affects the integrity of the bonded structure. Thus, wafer breakage, in particular damaging of the surface 109 of the active layer 102 and/or damaging of the final HR carrier substrate 107, can occur during this mechanical separation step.

Alternative DLT processes are also known, wherein, starting from the compound 106, a final carrier substrate of a polymer material is over-molded onto the backside of the active layer 102 instead of being attached thereto by direct bonding or layer transfer technologies. It is known that in the resulting compound, prior to the mechanical separation of the temporary Si handle substrate 104, the final carrier substrate is also attached to the temporary Si handle substrate 104 at edge regions thereof.

Thus, further to the aforementioned risk of wafer breakage, known alternative DLT processes also present risks that a complete separation of the temporary Si handle substrate 104 cannot be achieved properly, in particular at the attached overlapping edge regions of the temporary handle substrate 104 and the carrier substrate 107.

An object of the present disclosure is, therefore, to provide an improved DLT process for replacing an initial carrier substrate of an active layer device taking into account the aforementioned problems.

In particular, an object of the present disclosure is to improve the mechanical separation of a temporary handle substrate from an active layer preventing wafer breakage and damaging of a surface of the active layer.

BRIEF SUMMARY

The object of the disclosure is achieved with a method for mechanically separating layers as described herein.

In this context, a "substantially symmetrical mechanical structure" means that, even if the layer of temporary handle substrate and the layer of final carrier substrate have different intrinsic mechanical properties (elasticity/rigidity, fracture toughness, etc.) and/or different geometries (thickness, shape, etc.) with respect to each other, they are provided such that the global mechanical properties on either side of the active layer are substantially the same when the mechanical separation is initiated. Consequently, the mechanical constraints during the mechanical separation step are distributed evenly on either side of the active layer, which avoids wafer breakage or incomplete separation, as will be further detailed hereafter.

Mechanical and geometrical properties such as rigidity and thickness of the replacement carrier substrate can be very different from those of the temporary handle substrate, which is chosen initially so as to achieve a successful mechanical separation of the original carrier substrate in the early steps of the known DLT processes. These mechanical and/or geometrical asymmetries can be even larger when the replacement carrier substrate is provided as a composite stack of layers of materials having different mechanical properties.

It was found out that the mechanical asymmetry (elasticity/rigidity, fracture toughness, etc.) between the temporary handle substrate and the final HR carrier substrate was affecting the mechanical force needed to remove the temporary Si handle substrate. It was also found out that the geometrical asymmetry (thickness, shape, etc.) between the final carrier substrate and the temporary handle substrate could also affect the mechanical separation.

Thus, after providing the replacement carrier substrate onto the active layer, for the subsequent mechanical separation of the temporary handle substrate, the present disclosure allows that mechanical constraints are spread evenly between the temporary handle substrate and the replacement carrier substrate. This minimizes the maximal level of stress in the materials during the mechanical separation.

In particular, in advantageous embodiments, it was found that having similar products of the Young's modulus of the substrate material and the thickness of the layer cubed, or $Et^3$ products, for the temporary handle substrate and the carrier substrate allowed obtaining similar deformations. Here, by "similar $Et^3$ products," it is meant that the difference between both $Et^3$ products should preferably be in a range of about 20% or less. Thus, wafer breakage could be avoided. In contrast, using a temporary handle substrate and a replacement carrier substrate having very different $Et^3$ products was more likely to lead to wafer breakage.

In some embodiments, it can be advantageous to provide the replacement carrier substrate with one or more chamfered edges, such that a direct contact between the temporary handle substrate and the replacement carrier substrate can be avoided. This has the advantage to facilitate the insertion of a blade or an edge at the mechanical separation interface such that pressure can be applied evenly on the temporary handle substrate and on the carrier substrate in view of initiating the mechanical separation of the temporary handle substrate.

This was found particularly advantageous in embodiments of a DLT process, wherein the replacement carrier substrate can be over-molded onto the active device layer. Indeed, since the replacement carrier substrate must have a high adherence to the backside of the active layer or circuit, when it is over-molded onto the active layer, like for instance in the known DLT process illustrated in FIG. 2, the edges of the temporary handle substrate and of the replacement carrier substrate have also a high adherence to one another and, consequently, break during the mechanical separation, as they are subject to excess efforts in compression.

This was also found advantageous in embodiments, wherein the replacement carrier substrate can be provided as a preformed layer, which is attached, possibly after optional surface preparation steps, to the backside of the active layer. In such embodiments, the chamfered edges can be provided, for instance by polishing or etching, on the layer of replacement carrier substrate before and/or after its attachment to the backside of the active layer.

In some embodiments, a configuration can be provided allowing the transfer of an active layer from a temporary handle substrate onto a final or replacement carrier substrate having a composite structure. For instance, it was found that a replacement carrier substrate having a "soft" layer, for instance of a polymer, could be advantageous to limit the risk of wafer breakage during the mechanical separation of the temporary handle substrate. In particular, for composite replacement carrier substrates, it was found advantageous to replicate the mechanical structure of the replacement carrier substrate onto the temporary handle substrate.

Thus, the present disclosure advantageously provides a correction of the asymmetrical behavior of DLT bonded wafers prior to the mechanical separation of the temporary handle substrate. In particular, in order to avoid wafer breakage and to allow complete separation of the temporary handle substrate, the structure of the final carrier substrate can be replicated onto the temporary handle substrate. The present disclosure was found especially advantageous for final carrier substrates having composite structures.

BRIEF DESCRIPTION OF THE DRAWINGS

The disclosure will be described in more detail in the following, based on advantageous embodiments described in combination with the following figures.

DETAILED DESCRIPTION

Figure 1:
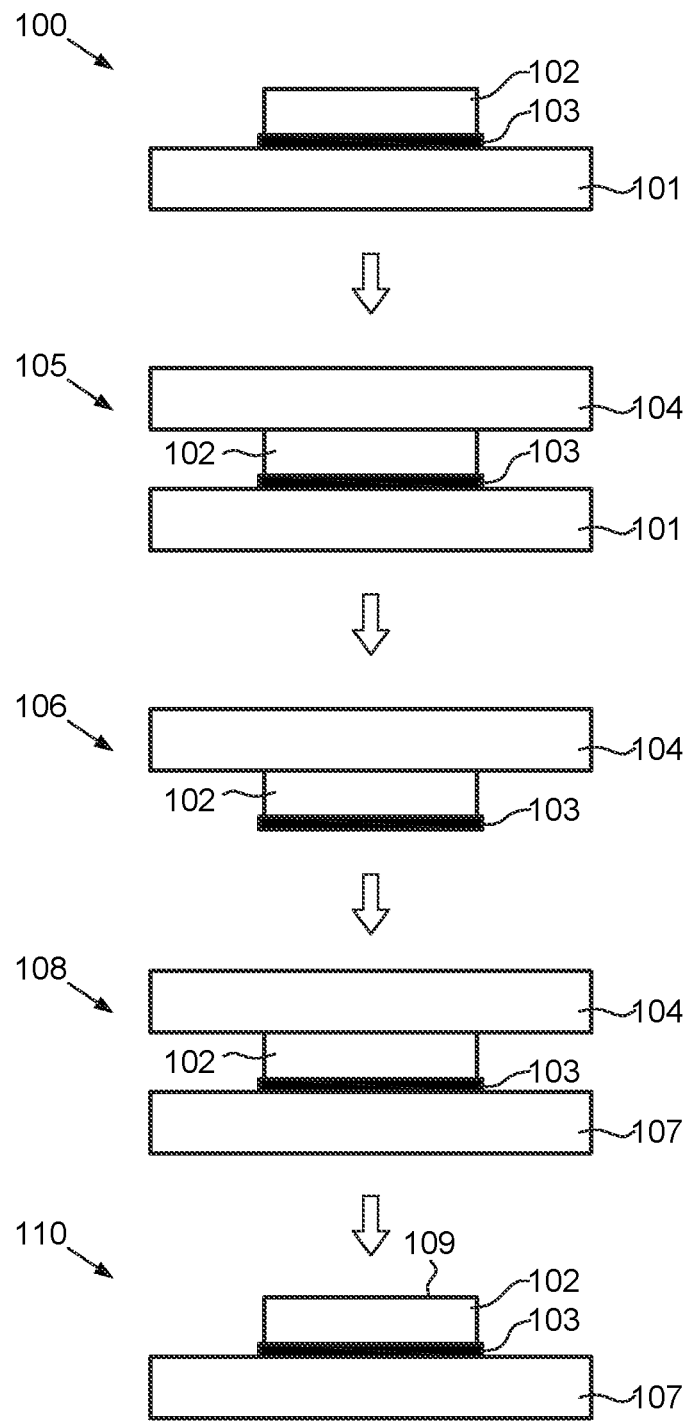
FIG. 1 schematically illustrates a known DLT process.
Figure 2:
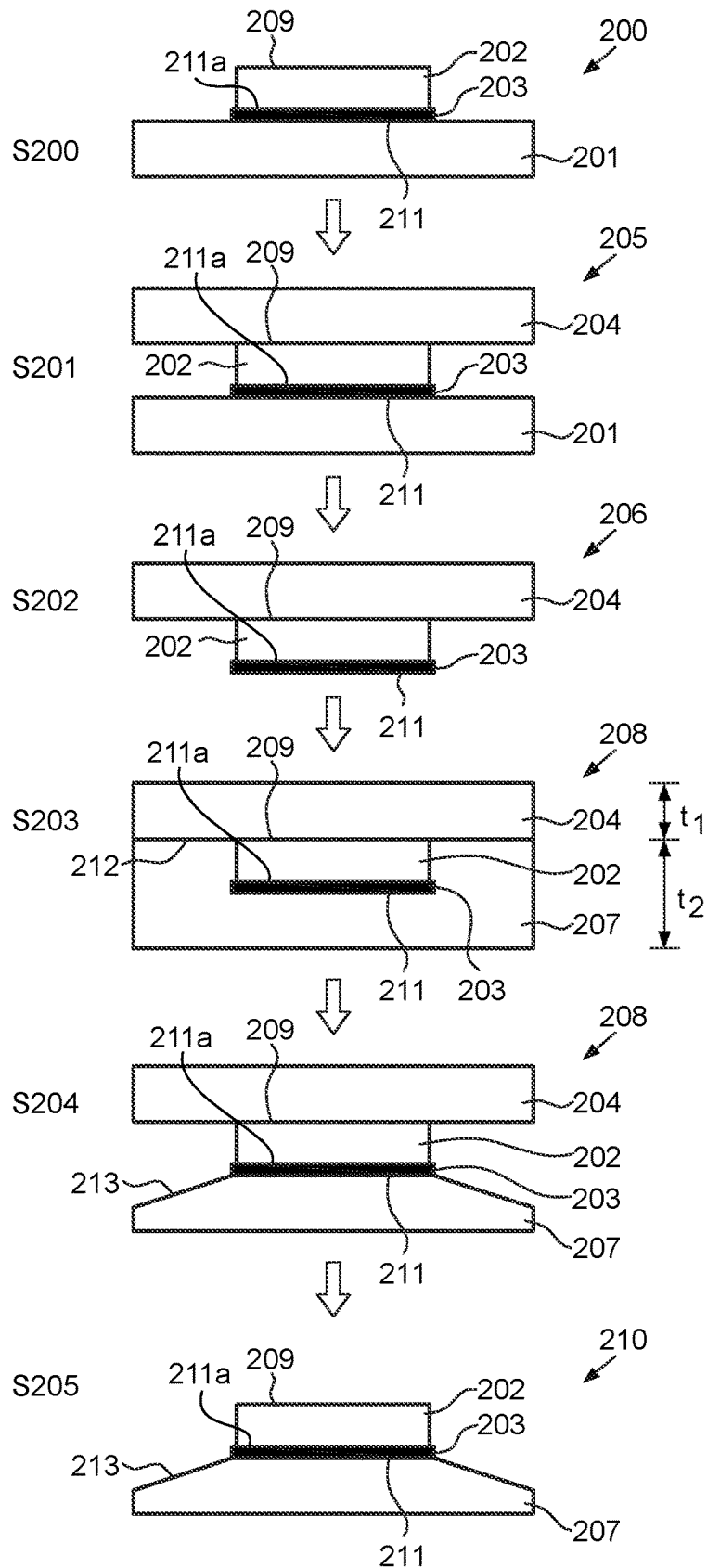
FIG. 2 schematically illustrates a first exemplary embodiment of a method of mechanical separation according to the present disclosure.

FIG. 2 schematically illustrates a first exemplary embodiment of the present disclosure. In this embodiment, a variant of the method for mechanically separating layers according to the present disclosure will be used in a DLT process carried out to replace an original carrier substrate 201 of an existing active layer device 200 with a new, preferably performance-enhancing, carrier substrate 207. The first steps, S200 to S202, of the DLT process illustrated in FIG. 2 can be similar to those of the known DLT process illustrated in FIG. 1.

Thus, in the first embodiment, in step S200, the initial active layer device 200 is provided and comprises a layer of an initial carrier substrate 201 carrying an active device layer 202. In the first embodiment, the initial carrier substrate 201 can be a Si carrier substrate, but in other embodiments, the initial carrier substrate 201 could be glass, sapphire, AsGa, or the like. Optionally, depending on the process used to provide the initial active layer device 200, as illustrated in FIG. 2, the active layer 202 can also comprise a buried oxide (BOX) layer 203 at its backside or interface 211 with the layer of initial carrier substrate 201. Interface 211 will be used to refer to the backside of the BOX layer 203 that is attached to the layer of the carrier substrate 201 while interface 211a will be used to refer to the backside of the active layer 202.

Then, in step S201, as further illustrated in FIG. 2, a layer of a temporary Si handle substrate 204 is attached to a front side 209 of the active layer 202, which is the free side opposite the interface 211 with the layer of initial Si carrier substrate 201, thereby forming an intermediate compound 205. While Si is commonly chosen as the material for the temporary handle substrate 204, it will be clear to the skilled person that other materials could be chosen instead, depending especially on the properties of the initial carrier substrate 201 or of the new carrier substrate 207, as will be explained hereafter.

Then, in step S202, as further illustrated in FIG. 2, the layer of initial Si carrier substrate 201 is detached from the intermediate compound 205. Mechanical separation is achieved using a blade or an edge inserted between the layer of temporary Si handle substrate 204 and the layer of initial Si carrier substrate 201 or at the interface 211 between the layer of initial Si carrier substrate 201 and the BOX layer 203, possibly using the layer of temporary Si handle substrate 204 as fulcrum point for exerting pressure on the layer of initial Si carrier substrate 201. Since the layer of Si handle substrate 204 is only used temporarily, it is not relevant whether it is damaged during this step. With this mechanical separation, the layer of initial Si carrier substrate 201 is detached, thereby forming another intermediate compound 206 in which the backside 211a is now free.

Then, in step S203, as further illustrated in FIG. 2, a homogeneous layer 207 of a high resistivity material, for instance, a polymer such as SU-8, or glass, or a ceramic glue, or a material having a resistivity of at least 10 kΩ·cm is over-molded onto the backside 211a of the active layer 202 and/or the backside 211a of the BOX layer 203. This avoids using complex steps of surface preparation in comparison with the known DLT process illustrated in FIG. 1. In this step, due to the molding, the layer of new carrier substrate 207 and the layer of temporary Si handle substrate 204 adhere to one another at edge regions 212.

In order to avoid wafer breakage when initiating mechanical separation of the layer of temporary Si handle substrate 204, the layer of new carrier substrate 207 should preferably be provided with a similar mechanical structure. In particular, according to an advantageous variant of the present disclosure, the layer of new carrier substrate 207 can be selected with a Young's modulus $E_2$ and a thickness $t_2$ such that its $E_2 \cdot t_2^3$ product matches the corresponding $E_1 \cdot t_1^3$ product of the layer of temporary Si handle substrate 204, that is $E_2 \cdot t_2^3 \approx E_1 \cdot t_1^3$, preferably within about 20% or less. Thus, the material for the layer of new carrier substrate 207 can be chosen accordingly. In fact, in preferred embodiments, depending on which material is selected first between that of the temporary handle substrate 204 or that of the new carrier substrate 207, it is possible to select the layer, in particular the material, of the other layer with appropriate Young's modulus and thickness so as to satisfy the above relationship within the given tolerance range of about 20% or less. In other words, the layer of temporary handle substrate 204 and/or the layer of new carrier substrate 207 can be chosen such that their $Et^3$ products are similar, in particular within about 20% or less. Conversely, if a predetermined thickness $t_2$ is desired for the layer of new carrier substrate 207, it is also possible to add an intermediate, optional, thinning step of the layer of temporary Si handle substrate 204 such that its thickness $t_1$ allows the aforementioned correspondence between the $Et^3$ products. In this way, it is possible to provide the layer of new carrier substrate 207 and the layer of temporary Si handle substrate 204 with essentially symmetric mechanical structures and properties, thereby favoring a complete subsequent mechanical separation of the layer of temporary Si handle substrate 204.

Then, in step S204, as further illustrated in FIG. 2, alternatively or in addition to adjusting the $Et^3$ products, according to another advantageous variant of the present disclosure, the edges 213 of the layer of new carrier substrate 207 can be chamfered at the overlapping edge regions 212 with the layer of temporary Si handle substrate 204 such that no or little contact exists between the layer of new carrier substrate 207 and the layer of temporary Si handle substrate 204. This can be done for instance by known methods such as etching, in particular chemical etching, or bevel polishing. In this way, it becomes easier to insert a blade or an edge between the layer of temporary Si handle substrate 204 and the layer of new carrier substrate 207 to initiate the mechanical separation of the layer of temporary Si handle substrate 204.

Furthermore, since it is now the layer of temporary Si handle substrate 204 that needs to be detached, the layer of new carrier substrate 207 can be a fulcrum point for using the blade or edge during the mechanical separation. The chamfered edges 213 can then also advantageously prevent the layer of new carrier substrate 207 from being damaged by the lever action of the blade or edge during the mechanical separation.

Thus, in the first embodiment, the inventive method allows detaching the layer of temporary Si handle substrate 204 without risking wafer breakage and without damaging the layer of new carrier substrate 207 or the active layer 202. Step S205 in FIG. 2 further illustrates that, once the layer of temporary Si handle substrate 204 is detached, a final new active layer device 210 is achieved, wherein the new, performance-enhancing, carrier substrate 207 has replaced the initial Si carrier substrate 201 of the initial active layer device 200.

Figure 3:
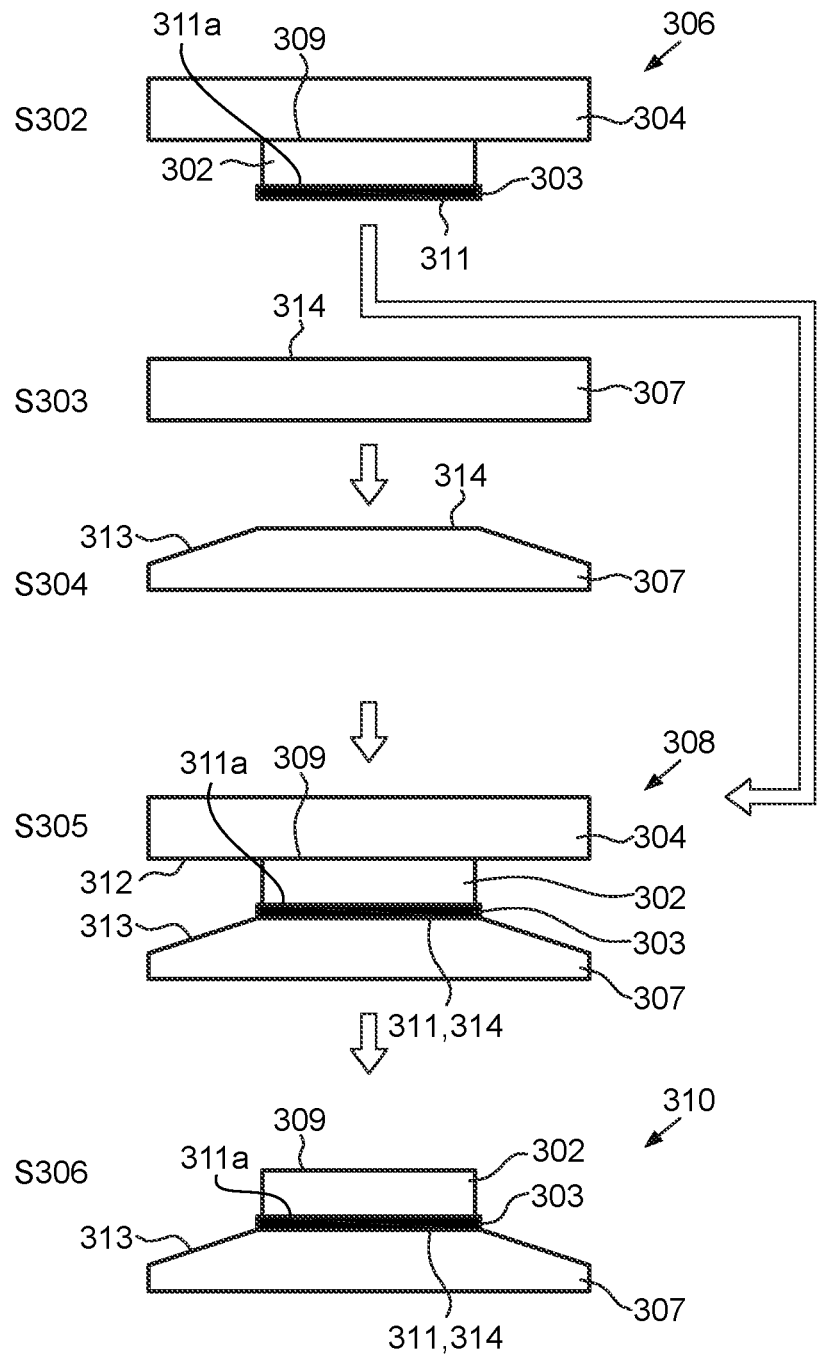
FIG. 3 schematically illustrates a second exemplary embodiment of a method of mechanical separation according to the present disclosure.

FIG. 3 schematically illustrates a second exemplary embodiment of the disclosure. In this embodiment, a variant of the method for mechanically separating layers according to the present disclosure will be used in another DLT process, different from that of the first embodiment, carried out to replace the original carrier substrate of an existing active layer device with a new, preferably performance-enhancing, carrier substrate 307.

As illustrated in FIG. 3, in step S302, a semiconductor compound 306 is provided, comprising a layer of a Si handle substrate 304 attached to a front side 309 of an active layer 302. The active layer 302 optionally comprises a layer of an oxide 303 at its backside 311a. In this embodiment, the semiconductor compound 306 can be in all aspects similar to the intermediate compound 206 of the first embodiment. Thus, in the second embodiment, although the first two steps are not illustrated in FIG. 3, the semiconductor compound 306 may have been provided in steps S300 to S302 which correspond to the steps S200 to S202 of the first embodiment, respectively. Thus, it is referred back to the description above in this respect.

In step S303, as illustrated in FIG. 3, a layer of a homogeneous high resistivity material 307, for instance, an RF substrate or a polymer such as SU-8, or glass, or a ceramic glue, or a material having a resistivity of at least 10 kΩ·cm, is provided. However, unlike the first embodiment illustrated in FIG. 2 which relates to a DLT process in which the layer of new carrier substrate 207 is over-molded onto the backside 211a of the active layer 202 or the backside 211a of the BOX layer 203, the second embodiments relates to a DLT process in which the layer of new carrier substrate 307 is provided as an already preformed layer with a side 314 configured for being attached or bonded to the backside 311a of the active layer 302 of the backside 311 of the BOX layer 303.

Then, in step S304, as further illustrated in FIG. 3, according to an advantageous variant of the present disclosure, edge regions 313 of the side 314 can be chamfered. This step can be done by known methods, such as etching, thinning, polishing and the like.

Then, in step S305, as further illustrated in FIG. 3, the layer of new carrier substrate 307 with chamfered edges 313 is attached to the backside 311a of the active layer 302 or the backside 311 of the BOX layer 303, forming an intermediate compound 308, which is analogous to the intermediate compound 208 in step S204 of the first embodiment and presents the same advantages. It is, therefore, referred back to the first embodiment as described with reference to FIG. 2 for more details. For instance, the same advantages regarding the insertion of the blade or edge to initiate the mechanical separation are achieved.

The skilled person will appreciate that, in variants of the second embodiment, the step S304 of chamfering the edge regions 313 of the layer of new carrier substrate 307 could also be realized after the step S305 of attaching the layer of new carrier substrate 307 to the semiconductor compound 306.

Furthermore, depending on the technology used for attaching the layer of new carrier substrate 307 to the active layer 302, optional intermediate steps of surface preparation may be required but are not essential for carrying out the disclosure. In addition, like in the first embodiment, it is also preferable to match the corresponding $Et^3$ products of the layer of temporary Si handle substrate 304 and of the layer of new carrier substrate 307. Thus, optional additional steps of thinning of the layer of temporary Si handle substrate 304 might also be advantageous.

Thus, in the second embodiment, the inventive method also allows detaching the layer of temporary Si handle substrate 304 without risking wafer breakage and without damaging the layer of new carrier substrate 307 or the active layer 302. Step S306 in FIG. 3 further illustrates that, once the layer of temporary Si handle substrate 304 is detached, a final new active layer device 310 is achieved, wherein the new, performance-enhancing, carrier substrate 307 with chamfered edges 313 has replaced the initial Si carrier substrate of the initial active layer device.

Figure 4:
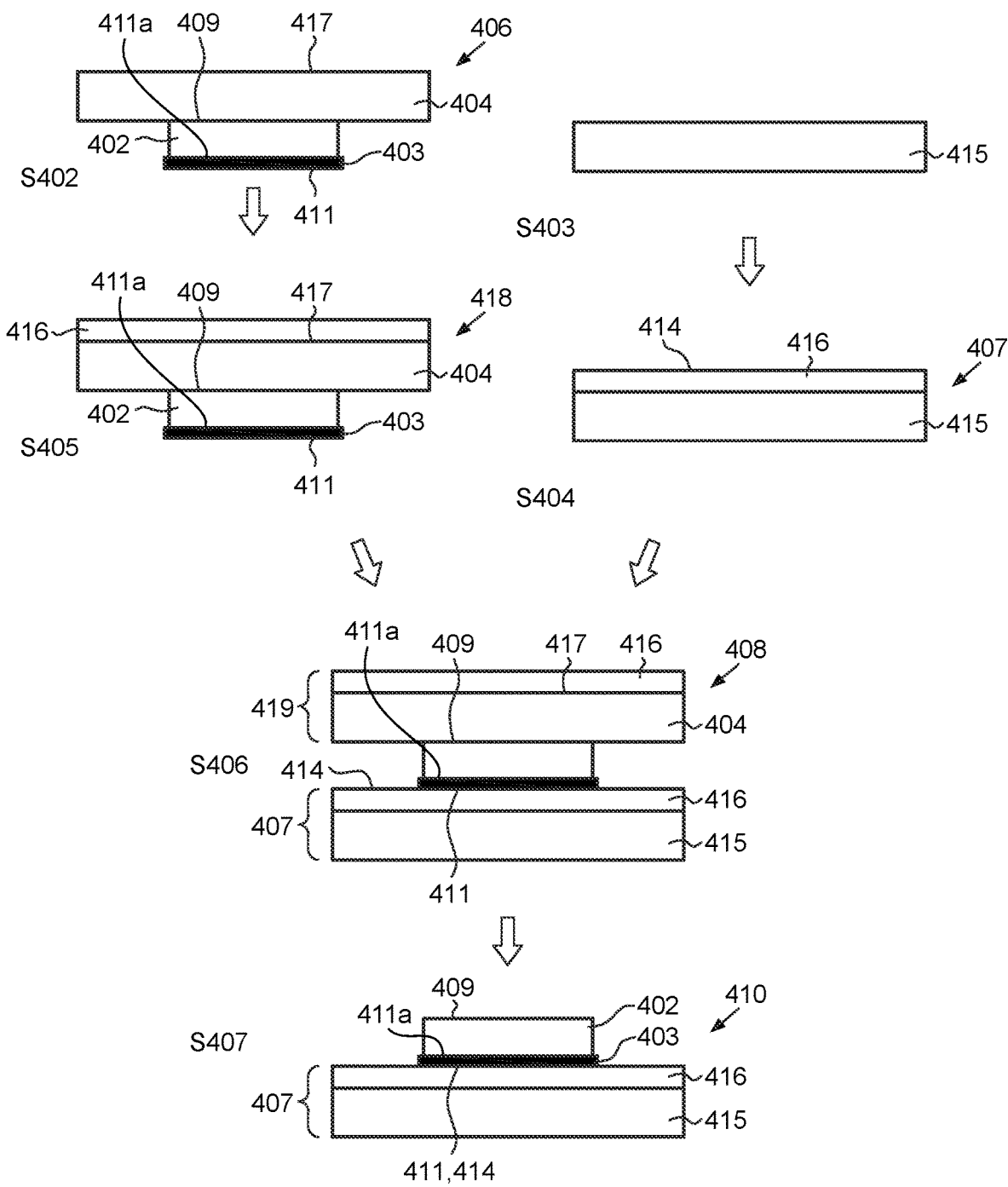
FIG. 4 schematically illustrates a third exemplary embodiment of a method of mechanical separation according to the disclosure.

FIG. 4 schematically illustrates a third exemplary embodiment of the disclosure. In this embodiment, a variant of the method for mechanically separating layers according to the present disclosure will be used in yet another type of DLT process carried out to replace the original carrier substrate of an existing active layer device with a new, preferably performance-enhancing, carrier substrate 407.

As illustrated in FIG. 4, in step S402, a first semiconductor compound 406 is provided, comprising a layer of a Si handle substrate 404 attached to a front side 409 of an active layer 402. Like in the previous embodiments, the active layer 402 can optionally comprise a layer of an oxide 403 at its backside 411a. In this embodiment, the first semiconductor compound 406 can be in all aspects similar to the intermediate compounds 206 and 306 of the previous embodiments. Thus, in the third embodiment, although the first two steps are not illustrated in FIG. 4, the first semiconductor compound 406 can have also been provided in steps S400 to S402, which correspond for instance to the steps S200 to S202 described in the first embodiment, respectively. Thus, it is referred back to the description above in this respect.

In the third embodiment, the layer of new carrier substrate 407 is provided as a composite or multi-layer substrate:

In step S403, as illustrated in FIG. 4, a mechanical support layer 415, such as a single-crystal or a poly-crystal Si wafer, is provided. Other materials such as glass, sapphire, AsGa, or the like could also be suitable.

Then, in step S404, as further illustrated in FIG. 4, at least one layer of a high resistivity (HR) material 416, such as a ceramic glue, a polymer, a polysilicon, or a material having a resistivity of at least 10 kΩ·cm, is deposited on the mechanical support layer 415, thereby forming the composite carrier substrate 407. In alternative embodiments, the layer of HR material 416 could also be provided as a stack of layers of HR materials, deposited one on top of the other onto the mechanical support layer 415. For instance, a layer of HR material 416 with a thickness between about 30 µm and about 200 µm could be deposited.

In the third embodiment, in step S405, as further illustrated in FIG. 4, following an advantageous variant of the present disclosure, the mechanical structure of the composite substrate layer 407, in particular the structure of its one or more layer(s) of HR material 416, is replicated onto the free side 417 opposite the active layer 402 of the first semiconductor compound 406. Thus, essentially the same layer or stack of layers of HR material 416 is also deposited, in the same order as for the layer of new carrier substrate 407, onto the surface of free side 417 of the first semiconductor compound 406, thereby forming another intermediate compound 418, wherein the layer of temporary Si handle substrate 404 and the layer of deposited HR material 416 form a new temporary handle compound 419 for handling the active layer 402.

Then, in step S406, the free surface 414 of the uppermost layer of the stack or of the single layer of HR material 416 is attached to the backside 411a of the active layer 402 or the backside 411 of the optional oxide layer 403, thereby forming another subsequent intermediate compound 408, which is comparable to the intermediate compounds 208 and 308 of the previous embodiments and present analogous advantages, as the mechanical properties of the layer of composite new carrier substrate 407 and of the intermediate compound 418 are essentially symmetrical, thereby favoring a subsequent mechanical separation step.

The skilled person will appreciate that, in variants of the third embodiment, the step S405 of replicating the mechanical structure of the composite substrate layer 407, in particular the structure of its one or more layer(s) of HR material 416, onto the free side 417 opposite the active layer 402 of the first semiconductor compound 406, could also be realized after the step S406 of attaching the layer of new carrier substrate 407 to the backside 411a of the active layer 402 or the backside 411 of the oxide layer 403.

Other advantageous aspects of the previous embodiments are also compatible with the third embodiment. For instance, in a variant, edge regions of the layer of composite carrier substrate 407 could optionally also be chamfered as described in the second embodiment.

Depending on the technology used for attaching the layer of composite new carrier substrate 407 to the backside 411a of the active layer 402 or the backside 411 of the oxide layer 403, optional intermediate steps of surface preparation may be required but are not essential for carrying out the disclosure. Furthermore, like in the previous embodiment, it is also preferable to match the corresponding $Et^3$ products as much as possible between the layer of composite new carrier substrate 407 and the temporary handle compound 419. Thus, an additional thinning step of the layer of temporary Si handle substrate 404 could optionally be carried out prior to the step S405 of replicating the mechanical structure of the layer of composite new carrier substrate 407 onto the free side 417 of the first semiconductor compound 406.

In the third embodiment, mechanical separation is then initiated in the intermediate compound 408, for instance by inserting a blade or an edge between the layer of temporary handle compound 419 and the layer of composite new carrier substrate 407, after step S406. The inventive method allows a complete separation of the temporary handle compound 419, comprising the layer of temporary Si handle substrate 404 with the replicated layer(s) of HR material 416, without risking wafer breakage and without damaging the new layer of the carrier substrate 407 or the active layer 402. Step S407 in FIG. 4 further illustrates that, once the temporary handle compound 419 is completely detached, a final new active layer device 410 is achieved, wherein the new, performance-enhancing, composite carrier substrate 407 has replaced the initial carrier substrate of the initial active layer device.

The present disclosure, by providing a method for mechanically separating layers, wherein the mechanical structure of the replacement carrier substrate is replicated onto the temporary handle substrate, avoids the risks of wafer breakage or of damaging of the active layer or of the new carrier substrate during the mechanical separation step of DLT processes.

What is claimed is:

1. A wafer structure, comprising:
   a first substrate;
   a layer of a first material attached to the first substrate; and
   a second substrate attached to the layer of the first material such that the layer of the first material is disposed between the first substrate and the second substrate; and
   wherein the wafer structure has a substantially symmetrical mechanical structure relative to the layer of the first material; and
   wherein the first substrate has a first thickness and the second substrate has a second thickness different from the first thickness, or a second material of the first substrate exhibits a first Young's modulus and a third material of the second substrate exhibits a second Young's modulus different from the first Young's modulus.

2. The wafer structure of claim 1, wherein the first substrate and the second substrate have equal Et' products.

3. The wafer structure of claim 1, wherein the first substrate has the first thickness and the second substrate has the second thickness different from the first thickness, and the first substrate exhibits the first Young's modulus and the second substrate exhibits the second Young's modulus different from the first Young's modulus.

4. The wafer structure of claim 1, wherein the second substrate has a chamfered edge.

5. A wafer structure, comprising:
   a first substrate;
   a layer of material attached to the first substrate; and
   a second substrate attached to the layer of material such that the layer of material is disposed between the first substrate and the second substrate; and
   wherein the wafer structure has a substantially symmetrical mechanical structure relative to the layer of material; and
   wherein the second substrate comprises a homogeneous high resistivity material.

6. A wafer structure, comprising:
   a first substrate;
   a layer of material attached to the first substrate; and
   a second substrate attached to the layer of material such that the layer of material is disposed between the first substrate and the second substrate; and
   wherein the wafer structure has a substantially symmetrical mechanical structure relative to the layer of material; and
   wherein the second substrate has a resistivity of at least 10 k$\Omega$·cm.

7. A wafer structure, comprising:
   a first substrate;
   a layer of material attached to the first substrate; and
   a second substrate attached to the layer of material such that the layer of material is disposed between the first substrate and the second substrate, wherein the second substrate comprises:
      a support layer; and
      at least one layer of a high resistivity material, the at least one layer of the high resistivity material disposed between the layer of material and the support layer; and
   wherein the wafer structure has a substantially symmetrical mechanical structure relative to the layer of material.

8. The wafer structure of claim 7, wherein the at least one layer of high resistivity material is in direct physical contact with the layer of material.

9. The wafer structure of claim 7, further comprising a replica of the at least one layer of a high resistivity material on the first substrate.

10. The wafer structure of claim 7, wherein the support layer comprises silicon.

11. The wafer structure of claim 7, wherein the at least one layer of a high resistivity material has a thickness of from 30 µm to 200 µm.

12. The wafer structure of claim 7, wherein the at least one layer of a high resistivity material has a resistivity of at least 10 k$\Omega$·cm.

* * * * *

UNITED STATES PATENT AND TRADEMARK OFFICE
CERTIFICATE OF CORRECTION

| | |
|---|---|
| PATENT NO. | : 11,742,233 B2 |
| APPLICATION NO. | : 17/135340 |
| DATED | : August 29, 2023 |
| INVENTOR(S) | : Marcel Broekaart, Ionut Radu and Didier Landru |

It is certified that error appears in the above-identified patent and that said Letters Patent is hereby corrected as shown below:

In the Claims

Claim 2, Column 9, Line 32, change "equal $Et'$ products." to --equal $Et^3$ products.--

Signed and Sealed this
Sixteenth Day of April, 2024

Katherine Kelly Vidal
*Director of the United States Patent and Trademark Office*